United States Patent [19]

Phillips

[11] 3,909,915

[45] Oct. 7, 1975

[54] BONDING APPARATUS

[76] Inventor: Leopold Samuel Phillips, 30 Howberry Road, Canons Park, Edgware, Middlesex, England

[22] Filed: Oct. 3, 1973

[21] Appl. No.: 403,103

[30] Foreign Application Priority Data

Oct. 10, 1972 United Kingdom............... 46621/72

[52] U.S. Cl. ..................... 228/160; 29/628; 29/626; 228/5.1; 228/180; 228/213

[51] Int. Cl.² .......................................... B23K 31/02

[58] Field of Search ......... 228/4, 5, 6, 13; 29/471.1, 29/493, 497.5, 626, 628

[56] References Cited

UNITED STATES PATENTS

| | | | |
|---|---|---|---|
| 3,627,190 | 12/1971 | Ramsey | 228/4 |
| 3,640,444 | 2/1972 | Ludwig | 228/4 |
| 3,696,985 | 10/1972 | Herring et al. | 29/471.1 X |
| 3,699,640 | 10/1972 | Cranston et al. | 29/471.1 |
| 3,771,711 | 11/1973 | Lesyk et al. | 228/4 |
| 3,774,834 | 11/1973 | Holler et al. | 228/4 X |

*Primary Examiner*—Francis S. Husar
*Assistant Examiner*—Robert J. Charvat
*Attorney, Agent, or Firm*—Hill, Gross, Simpson, Van Santen, Steadman, Chiara & Simpson

[57] ABSTRACT

A method of and apparatus for effecting bonding of beam lead devices such as semiconductor integrated circuit chips to microcircuit or similar plate-like elements by use of the known compliant bonding technique in which the compliant bonding medium is of tape form, e.g. aluminum tape. Such tape medium is initially unperforated and is fed stepwise to the operative position coincident with the axis of movement of a reciprocating bonding ram where a window opening of appropriate size to accommodate the device to be bonded is formed therein by displaceable punching mechanism before the actual bonding step. A multiple punch turret provides a choice of window openings of different dimensions to accommodate different size devices. The compliant medium tape may be formed with an embossed region around each window opening by using the bonding ram as a forming tool in co-operation with an embossing die on the opposite side of the tape. A selection of different bonding rams may be provided on a rotatable turret as well as a number of different embossing dies on a further turret.

14 Claims, 9 Drawing Figures

BONDING APPARATUS

Figures 1, 2, 3, 4, 5, 6, 7, 8:
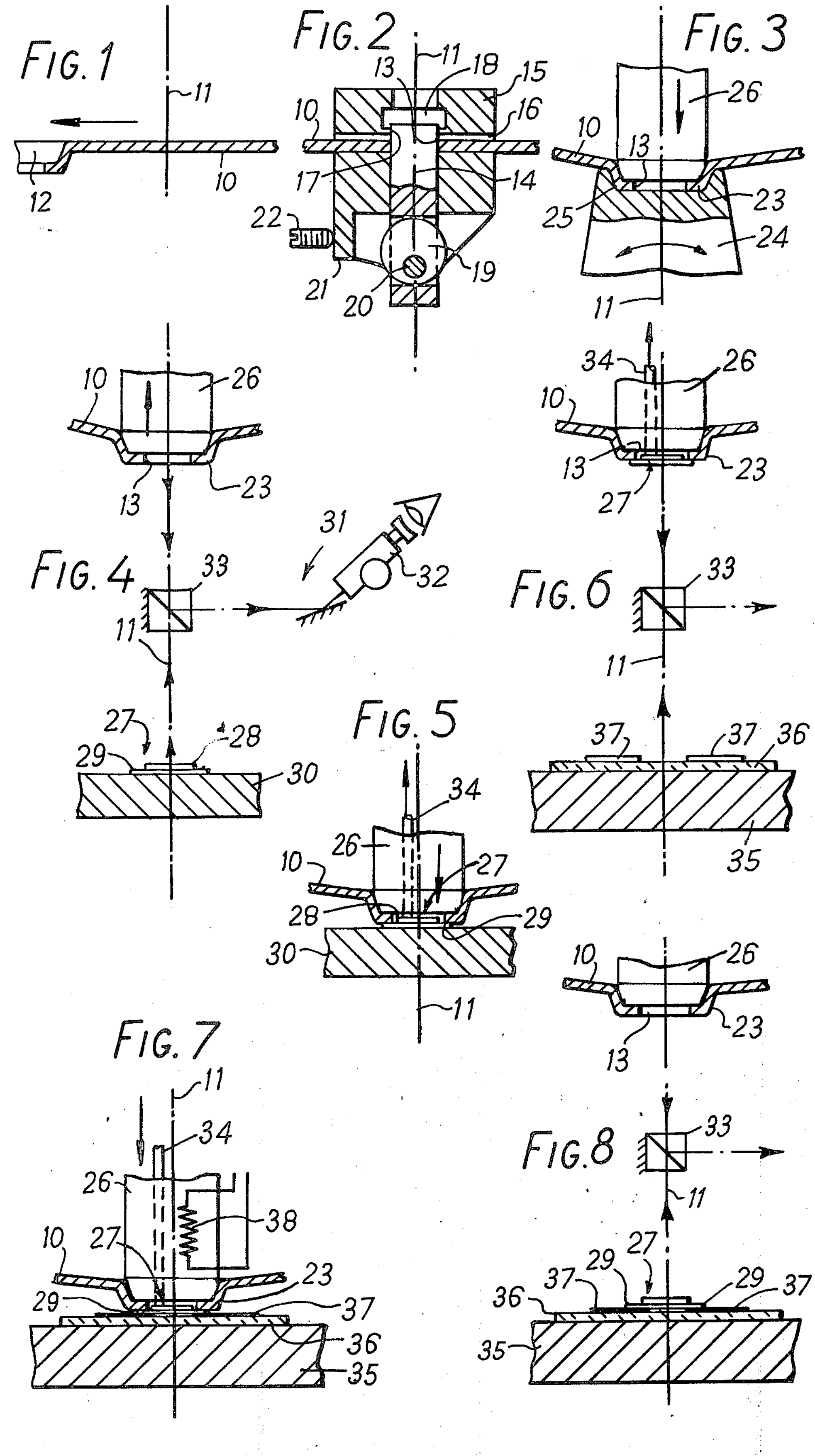

This invention relates to the bonding of beam lead devices, e.g. semiconductor integrated circuit chips, to microcircuit and other similar plate-like elements and is more particularly concerned with an improved method of and apparatus for such effecting bonding and employing the known compliant bonding technique.

Known arrangements for bonding beam lead integrated circuit devices include those utilizing either the wobble bonding technique or the compliant bonding technique as described, for instance, in U.S. Patent No. 3,533,155 of A. Coucoulas or in Proceedings 20th Electronic Components Conference, 1970, pages 380–389, in the article "Compliant Bonding" by A. Coucoulas.

The known arrangements suffer from the disadvantage that beam lead integrated circuit devices or chips of different size cannot be handled without making, for each change of chip size, a mechanical alteration to the bonding head system. In the case of appliances employing the wobble bonding technique this involves changing the bonding tool which comprises a tip having a recess only slightly larger than the size of the chip which is to be bonded. In the case of known appliances employing the compliant bonding technique the compliant medium is in the form of an aluminum tape having, along its length, a series of pre-punched windows each of dimensions slightly larger than those of the chip size which is then being handled. In order to change from one chip size to another the said tape medium must be changed to another having window punchings of the appropriately different size. In some cases, if the variation between the different chip sizes is large, it is necessary also to change the bonding ram itself.

In known arrangements employing either of the above techniques it is impracticable to bond a series of chips having various sizes in sequence within a commercial production set-up. Furthermore, the operation of changing the compliant medium and possibly the bonding ram also, are time consuming and therefore costly and may result in an unacceptably long downtime production. It has therefore usually been necessary heretofore to bond all chips of one size before replacing the tape or other medium, and possibly the bonding ram also in order to bond a group of chips of another size. The alternative hitherto has been to use more than one bonding machine, each of which is set up to handle only one size of chip. This results in increased capital expenditure and again can be disadvantageous in requiring transfer from one machine to another of a common microcircuit or other element to which chips of different size need to be bonded.

One object of the present invention is to provide a bonding apparatus employing the compliant bonding technique in which change of the compliant medium is unnecessary when it is desired to bond, in succession, beam lead devices or chips of different size, and thereby to permit the consecutive bonding of different sized chips under production conditions using only one machine.

In accordance with one feature of this invention, a beam lead bonder of the compliant bonding type utilizes a compliant tape and associated means of punching windows therein allowing such windows to be produced in the appropriate dimension, and in conformity with the sequence of devices presented for bonding, as part of the bonding operation. In one practical embodiment of the machine the tape is associated with punching mechanism in the form of a turret having a number of different size punches and arranged to permit selection and production of particular sized window holes as required in sequence.

A further feature of this invention resides in the mechanical means employed for eliminating the problems associated with the precise indexing and positioning, typically to within about 0.0001 in., of the tape window beneath the bonding ram in relation to the chip to be bonded. In accordance with this feature the window in the tape is punched centrally in the vertical axis through the bonding ram and hence in the central axis of the chip to be bonded ultimately. For this purpose the punch tool is made movable bodily and has means for translating it from an out-of-use or rest position to the punching position in the vertical axis of the ram where it is accurately located by means of mechanical stops so as to ensure the punched hole is produced in the precisely required position. Subsequent movement of the punched window in relation to the bonding ram after removal of the punch tool is prevented by maintaining the bonding ram in contact with the tape under slight tension until after completion of the actual bonding step.

According to a further feature of the invention, means are provided to allow beam lead devices to be bonded on a circuit plate in close juxtaposition to one other by use of the known technique of embossing the tape to provide an area surrounding each window which is depressed beneath the plane of the main body of the tape, thus preventing the latter from coming into contact with an adjacent already bonded chip. In accordance with this feature of the present invention, the face of the bonding ram is shaped to correspond to that of the desired embossed configuration and such ram then used as an embossing punch which on vertical downward movement depresses the tape into a corresponding shaped die which is brought into position beneath the tape before this operation. The embossing process is carried out as a separate operation after the window punching process and before the subsequent operation of device pick-up, alignment and bonding.

In accordance with further features of the invention, means are provided for accommodating a range of different bonding rams suitable for widely differing device dimensions and for using these in chosen sequence: This may be effected by the use of a rotatable bonding tool turret, having a multiplicity of tools with dimensions suitable for handling the range of device sizes to be used. In operation, a bonding head suitable for the particular device to be bonded is selected at the same time as the window hole punch is chosen.

In order that the nature of the invention may be more readily understood one form of apparatus for bonding beam lead semiconductor devices or chips and embodying the invention and its manner of operation will now be described by way of illustrative example only and with reference to the accompanying drawings in which:-

Figure 9:
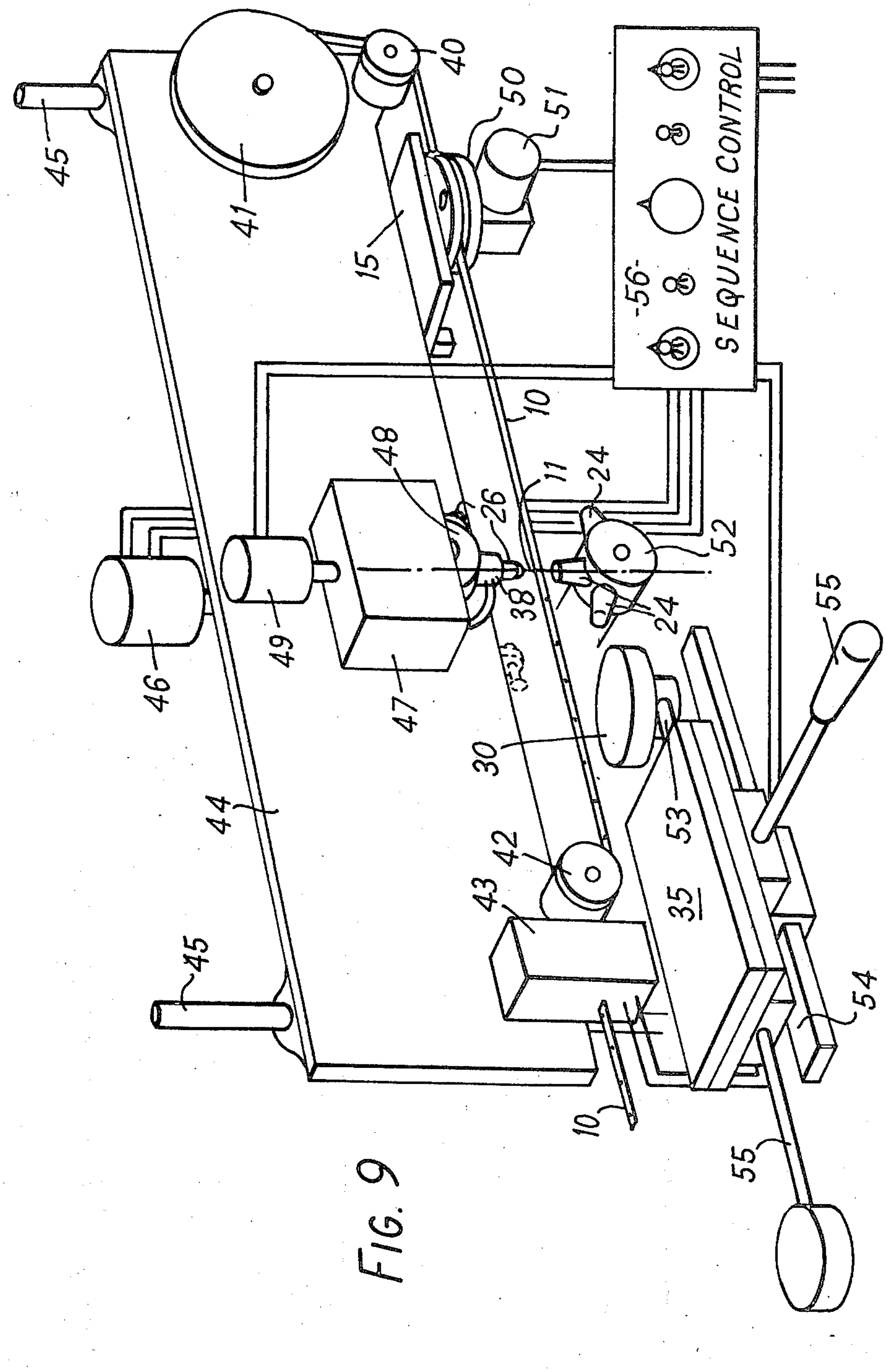

FIGS. 1–8 comprise a series of diagrams illustrating successive steps in the operation of the bonding apparatus while FIG. 9 is a perspective view, largely schematic in form, illustrating the general arrangement of one form of compliant bonding apparatus embodying the invention.

Referring first to FIGS. 1–8, and, particularly to FIG. 1, the compliant bonding medium is in the form of an aluminum tape 10 which is arranged to be drawn in step-by-step manner from a supply source through the axis 11 along which movement of the bonding ram in the eventual bonding operation is to take place. The axis 11, usually vertical, lies normal to the plane of the tape at the point of intersection therewith, which point is substantially at the middle of the tape width. As indicated in FIG. 1, the initial step in any new bonding operation involves stepping movement of the tape 10 so as to present a fresh unworked region of the tape around the said axis 11. Reference numeral 12 indicates the formed region of the tape which was used at the immediately preceding bonding operation.

The next step, illustrated in FIG. 2, involves the punching of a hole or window 13 in the tape precisely centred on the said axis 11. This window 13 is of a size and shape suitable to accommodate the next chip to be bonded and is determined by the cross-section of the chosen punch member 14 which is positioned for movement along the line of the axis 11 within a punch block 15 having a slot 16 for receiving the tape 10, a die-forming aperture 17 above the tape 10 to avoid the formation of edge burrs upon the tape undersurface and a waste discharge chute 18. Reciprocation of the punch member 14 is conveniently effected by rotation of an eccentric cam disc 19 secured to a spindle 20 rotatable in the block 15. The punch body 15 is normally held in an out-of-use or rest position where it is clear of the axis 11 and is translated, for the purpose of the window punching operation, to the operative position shown at which it is precisely positioned as by engagement of stop 21 thereon with an adjustable abutment screw 22 carried in a fixed part of the apparatus.

After punching of the window 13 the next step, shown in FIG. 3, is the formation of an embossed or downwardly depressed region 23 around the periphery of the window opening 13 in order to allow, in already known manner, the bonding of a chip in close spaced relationship to other already-bonded chips on a common substrate or microcircuit device. This embossing is effected by maintaining the tape 10 with its window aperture 13 registered on the axis 11 while the punch means including block 15 and member 16 is moved back to its rest position. An embossing die 24 having a forming aperture 25 of appropriate shape therein is then brought to correct position beneath the tape 10, relative to the axis 11; the bonding ram itself, indicated at 26 is shaped for use as an embossing punch and is moved downwardly along the axis 11 to press the tape into the forming aperture 25 and so give it the desired embossed configuration. As indicated in FIG. 3, this downward movement of the bonding ram 26 causes slight depression of the tape between its respective points of support on either side of the axis 11. This slightly displaced condition of the tape is maintained even when, as indicated in FIG. 4 illustrating the next operative step, the bonding ram 26 and the tape 10 are raised bodily to a position above that previously occupied by the tape in FIGS. 1 and 2. The purpose of this maintenance of the displaced tape condition is to ensure that it is continuously held in contact with the bonding ram under slight tension and so avoid accidental displacement or the need to effect subsequent reregistration as would be necessary if the ram and tape were separated.

Referring now to FIG. 4, the next step involves the bringing into position, in coincidence with the axis 11, of the integrated circuit device or chip which is to be bonded. This chip is shown at 27 and comprises a semiconductor body 28, usually of square or rectangular shape, from some or all of the sides of which project the beam leads 29 which have, eventually, to be bonded to appropriate connection points on the microcircuit or equivalent plate. The chip 24 is supported upon the upwardly facing surface of a chip tray 30 which is also movable from the operative position shown to a second, out-of-use or rest, position clear of the axis 11. The chip tray 30 is adjustable in the horizontal plane in both *x* and *y* directions, as well as being rotatable, to permit the chip 27 thereon to be precisely positioned relative to the axial line 11 so that its body 18 lies accurately registered relative to the window 13 in the overlying tape 10. Inspection and comparison of the chip body 28 with the window 13 is effected with the aid of optical means 31 including a microscope 32 and beam splitting means, such as a beam splitting prism 33.

After accurate positioning of the chip 27 upon the chip tray 30, the next step, as shown in FIG. 5, is the lowering of the bonding ram 26 and the embossed region 23 of the tape 10 on to the chip 27 so that the body 28 is accommodated within the window 13. At this point, suction is applied by way of conduit 34 in the bonding head 26, whereby the chip is now held, in its registered position, in the window 13 with its outwardly extending beam leads in contact with the undersurface of the embossed region 23 of the tape 10.

The next step, shown in FIG. 6, involves raising of the bonding ram 26, with the tape 10 still in contact therewith and with the chip 27 held in its registered position in the window 13, to an elevated position similar to that shown in FIG. 4. The chip tray 30 is now removed to a rest position and its place is taken by a similarly movable substrate platform 35 which also has a displaced out-of-use position, and upon which is carried the glass, ceramic or other substrate shown at 36 constituting the microcircuit or other equivalent plate-form element to which the chip 27 is to be bonded. Reference 37 indicated the thick or thin film or other conductive regions on the surface of the element 36 which are required to be bonded to the appropriately different ones of the beam leads 29 of the chip 27. The substrate platform, like the chip tray 30, is rotatable and adjustable in position horizontally in both *x* and *y* directions to permit the precise registration of the chip receiving area of the microcircuit element 36 thereon with the chip itself, particularly its beam leads. Such registration is effected with the aid of the same optical means 31 as was used during the chip positioning operation shown in FIG. 4.

After the element 36 has been accurately positioned relative to the axis 11 and the chip 27 suspended above it, in the next step, shown in FIG. 7, the bonding ram 26 is again lowered along with the embossed tape 10 and supported chip 27 to bring the beam leads 29 of the chip 27 into contact with the corresponding conductive areas 37 on the microcircuit element 36 while an appropriate bonding pressure is applied by means of the head 26 accompanied by suitable heating to an elevated temperature as by means of electric heater 38 associated with the ram. After the lapse of a suitable time interval, e.g. a few seconds, bonding should be complete and, after cutting off of the applied suction over conduit 34, the bonding ram 26 is again raised together with the tape 10 to the position shown in FIG. 8.

The chip 27 should now be bonded to the microcircuit element 36 and the correctness of this bonding can be examined with the aid of the same optical means 31 as previously employed in the steps shown in FIGS. 4 and 6. In addition to checking that the chip 27 is accurately positioned with each of its beam leads 29 appropriately registered in the related conductive areas 37 on the microcircuit element 36, an assessment of the bond strength and correctness can be made by observing, in known manner, the depressions formed around the window aperture 13 in the undersurface of the compliant medium tape 10.

After such inspection, the next bonding operation may be proceeded with using the same or a different microcircuit element and a further chip which, if of different size from that previously employed, may involve the use of a different punch member 14 after the tape 11 has been stepped forward to present a fresh unworked region thereof in register with the axis 11 as previously described with reference to FIG. 1.

One form of bonding apparatus arranged for operation according to the sequential steps already described with reference to FIGS. 1–8, is shown in FIG. 9 where the compliant medium tape 10 is fed over guiding and controlling roller 40 from a tape supply reel 41 through the axial line of bonding 11 and further guiding and controlling roller 42 to electrically operated step-by-step tape feed means 43. The supply reel 41, rollers 40, 42 and the feed means 43 are mounted on a carriage 44 which is arranged for upward and downward movement bodily along guides 45 which are secured to a fixed frame (now shown). Such carriage movement is under the control of appropriate electrically operated motor means 46. Also secured to the carriage 44 is means 47 carrying the upward and downwardly movable bonding ram 26, such movement being coincident as already explained with the axis 11. In this embodiment, a number of different bonding rams 26 are provided around a rotatable turret member 48 which can be indexed to different positions each presenting a different one of the rams for operative use. Such indexing is effected by electrically operated stepping mechanism, now shown, in the means 47. Each ram 26 is provided with heater means 38. The whole of the means 47, with the rams 26, is arranged for upward and downward movement, relative to the carriage 44, by further electrically operated motor means 49.

The punch block 15 includes a rotatable punch turret 50 and straddles the horizontal run of the tape 10 between the respective rollers 40, 42 and is movable along guides (not shown) mounted on the carriage 44 by suitable means (also not shown) between the rest position as actually indicated in the drawing and the operative position where one of its different punches lies precisely in register to the axial line 11. The punch turret is provided with electrically operated motor means 51 for actuating the selected one of its different punch tools when in register with the axial line 11. A further turret 52, disposed beneath the horizontal run of the tape 10, carries a selection of embossing dies 24 complementary to the different bonding rams 26. This turret 52 is rotatable to select the desired die by further electrically operated indexing means (not shown). Such stepping means may, if desired, be arranged for energisation in parallel with those in means 47 for the bonding ram turret 48.

Located beneath the horizontal run of the tape 10, even when the carriage 44 is in its lowermost position, is the chip tray 30 which is rotatably mounted upon an arm 53 extending from the substrate platform 35 which is movable along fixed guides 54 between the respective operative positions in register with the axis 11 and a left-hand displaced, out-of-use, position. The platform 35 and the chip tray 30 are provided with any suitable known form of micro-manipulator means as indicated at 55 for effecting precise movement to position the chosen chip and substrate relative to the axial line 11. The platform 35 and chip tray 30 are conveniently arranged for manual movement bodily between their out-of-use positions to those which embrace the axial line 11 but electrically operated motor means may be provided if desired.

The various electrically operated motor means employed may be rotating armature type electric motors or electromagnetic solenoid devices and are conveniently under the control of a sequence controller 56 whose step-by-step operation can be supervised by the operator. The required suction to hold the chip 27 in the window 13 is conveniently provided by means of a suitable suction pump also motor driven under the control of the said sequence controller 56.

It will be clear that many modifications may be made. For example, only a single bonding ram 26 and a single embossing die 24 may be provided. Alternatively the selection of the desired one of a plurality of different bonding rams, punches and embossing dies can be effected manually. Under some production conditions selection of the different forms of punch, embossing die and bonding ram may be effected automatically under the control of the sequence controller and any associated production control timer mechanisms in accordance with a pre-arranged schedule by which selected chips are placed in different positions on a common substrate. If a plurality of bonding rams are provided, those which are out of operative position may be held maintained at a lower temperature than the correct operative temperature by applying a reduced heating current theretol the full heating current being applied automatically in any particular bonding ram only when it is arranged in the operative position. Alternatively, full heating current may be applied at all times to all of the bonding rams. Ultrasonic vibratory energy may be used instead of or in addition to heating during the bonding operation. The spent tape may be removed by means of a suitable cutter or rewound on a take-up reel.

The optical means employed for inspection and position comparison are conveniently arranged to be movable into and out of operative position, such as by being pivoted for swinging movement around a vertical axis.

While the invention has been particularly described with relation to the bonding of beam lead integrated circuit chips, it is equally applicable to the bonding of other beam lead devices such as discrete diodes, transistors and other circuit elements.

I claim:

1. The method of effecting the individual compliant bonding of a single beam-lead semi-conductor device having any one of a range of different body sizes to a substrate which comprises the steps of:

a. providing a device for effectuating said bonding having a bonding ram movement axis;

B. providing a strip of compliant medium traversing the axis;

C. providing a multi-sized punching device having the capability of selectively punching one of a number of variously sized windows through the said medium;

D. advancing the strip across the axis to present an unworked region thereof at the axis;

E. moving the punching device to a punch position with portions of the device on both sides of the medium;

F. selecting the single semi-conductor device;

G. adjusting the punching device to align a selected sized punch carried by the punching device in precise alignment with the axis;

H. punching a selected sized window corresponding with the selected semi-conductor device through the medium at the axis;

I. removing the punching device to a rest position;

J. effectuating bonding of the selected semi-conductor device to the substrate using the area of the medium adjacent the thus formed window.

2. The method of claim 1 including the additional steps of:

A. providing a ram at the axis movable along the axis;

B. moving an end face of the ram into contact with the medium after the punching device has been removed from the area of the axis while maintaining the medium in fixed position relative to the axis and thereafter maintaining said end face of said ram in contact with said medium at the said axis without relative movement between the said end face and the end face contacted portions of the medium until after the semi-conductor device has been bonded to the substrate.

3. The method of claim 2 including the additional steps of forming an embossed region around the punched window before bonding the semi-conductor device to the substrate.

4. The method of claim 3 including the additional step of forming the embossed region by bringing the ram end face into contact with the medium adjacent the window and pressing portions of the medium around the window between the end face of the ram and an embossing die.

5. A method of effectuating the individual compliant bonding of a selected beam-lead semi-conductor device having any one of a range of different body sizes to a substrate which comprises the steps of:

A. providing a device for effectuating said bonding having a single bonding ram movement axis;

B. providing a ram member movable along said axis;

C. providing a selection of rams of different sizes on said ram member;

D. providing a selectively movable strip of compliant medium traversing the axis;

E. providing a punching device having a plurality of different sized punch portions thereon, each having the capability of selectively punching one of a number of variously sized windows through the said medium;

F. providing an embossing die member having a plurality of different sized dies thereon, each of the dies having a cavity complementary to an end face of one of the rams;

G. providing a movable substrate carrying anvil;

H. advancing the strip through the axis to present an unworked region thereof at the axis;

I. selecting a semi-conductor device having a body size to be bonded to a substrate;

J. moving the punching device to the axis;

K. selecting a punch from the punches carried by the punching device in accordance with the size of the selected semi-conductor device;

L. punching a window through said medium by said selected punch;

M. removing said punching device from the axis;

N. selecting a ram from among those carried by the ram member in accordance with the size of the punched window;

O. bringing the end face of the selected ram into contact with the medium adjacent the window by movement of the ram member along the axis;

P. selecting a die complementary to the selected ram from among those carried by the die member and presenting said die at the axis on the opposite side of the medium from the ram;

Q. embossing said medium between the die and the ram;

R. removing the medium from the die while maintaining contact between the ram end face and the embossed area of the medium;

S. aligning the selected semi-conductor device with the window;

T. moving the embossed area of the medium into contact with the portions of the semi-conductor while maintaining the medium in contact with the ram end face;

U. presenting the substrate anvil with a substrate thereon at the axis;

V. aligning the substrate with the semi-conductor device and embossed area of the medium;

W. forcing the semi-conductor device into pressure contact with the substrate by movement of the ram along the axis;

X. bonding the semi-conductor device to the substrate;

Y. removing the medium from contact with the semi-conductor device;

Z. removing the anvil with the semi-conductor device thereon from the axis; and

AA. removing the ram from contact with the medium and repeating steps H through AA--.

6. A device for effectuating the individual compliant bonding of beam-leads semi-conductor devices to a substrate comprising: a base member, a ram member mounted for movement with respect to said base member along a single axis, compliant medium supply and takeup means associated with said base member for selectively presenting unworked portions of a strip compliant medium carried by said supply and takeup means traverse said axis in a position to be contacted by portions of the said ram member, a punching member movably carried by said base member movable from a rest position remote from said axis to a punching position at said axis, said punching member having a plurality of different sized punches carried thereby, means for selectively presenting one of said punches at work position stradling said strip, means for actuating said selected punch to punch a window through said medium at said axis coincident with said axis whereby any one of a number of variously sized windows can be provided in the portion of the tape at said axis by selection of one of said punches carried by said punching device.

7. The device of claim 6 wherein the punching member comprises a rotatable punch turret supporting a plurality of punches and the means for selectively presenting one of said punches comprises means for rotating the turret to present a selected punch in register with the axis.

8. An apparatus according to claim 6 including an embossing die member positionable in alignment with the axis on the side of the medium opposite the ram member, the die member having a die cavity facing the ram member, said ram member having an end face of a ram dimensioned to cooperate with the die cavity to function as an embossing tool, said ram movable towards and away from said embossing die member effective to force a portion of said medium into said die cavity to emboss said medium.

9. An apparatus according to claim 8 wherein said embossing die member comprises a plurality of individual embossing dies of different sized cavities mounted upon a rotatable turret and control means are provided for moving said turret to place any one of said embossing dies in position opposite said ram at the axis.

10. The device according to claim 6 wherein the compliant medium carried by said supply and takeup means comprises an elongated tape, said supply and takeup means include a supply reel and a takeup reel with a tape extending therebetween, and stepping means are provided in association with said supply and takeup reels for feeding said tape through said axis selectively.

11. Compliant and bonding apparatus comprising: a base member, a ram member mounted for movement with respect to said base member along a single axis, said ram member including a turret carrying a plurality of different sized rams, each having an end face of different size, means for rotating said ram turret, compliant medium supply and takeup means associated with said base member on opposite sides of said axis, a tape of compliant medium supplied by said supply means and extending traverse of said axis to said takeup means, stepping means associated with said supply and takeup means for selectively advancing said tape across said axis, a punching member movably carried by said base member movable from a rest position remote from said axis to a punching position at said axis, said punching member including a rotatable punching turret having a plurality of different sized punches associated therewith, and means for selectively presenting any one of said punches at said axis when said punching member is in its punching position, said punching member in said punching position stradling said tape, means for actuating said one punch to punch a window through said medium at said axis concident with said axis.

12. The apparatus of claim 11 including an embossing die member associated with said base positioned on the side of said tape opposite said ram, said embossing die member comprising a turret carrying a plurality of dies having different sized die cavities complementary to the different sized end faces of said rams, means for rotating said embossing die turret to present a selected one of said dies at said axis opposite said ram, and an adjustable substrate carrying anvil movable between a work position at said axis on the opposite side of said tape from said ram and a rest position remote from said axis.

13. The apparatus of claim 10 wherein each of said rams has an orifice opening at the said end face, and suction means are provided to said orifice opening whereby a semi-conductor device may be picked up by moving said ram means with said suction means actuated, the suction means effective to hold the said semiconductor device at the said end face.

14. A device for effectuating the individual compliant bonding of beam-leads semi-conductor devices to a substrate comprising: a base member, a ram member mounted for movement with respect to said base member along a single axis, compliant medium supply and takeup means associated with said base member for selectively presenting unworked portions of a strip compliant medium carried by said supply and takeup means traverse said axis in a position to be contacted by portions of the said ram member, a punching member carried by said base member, said punching member having a plurality of different sized punches carried thereby, means for selectively presenting one of said punches at a work position stradling said strip, means for actuating said selected punch to punch a window through said medium at said axis coincident with said axis whereby any one of a number of variously sized windows can be provided in the tape by selection of one of said punches carried by said punching device.

* * * * *